United States Patent [19]

Pottebaum

[11] Patent Number: 4,662,830
[45] Date of Patent: May 5, 1987

[54] QUIET CENTRIFUGAL FAN

[75] Inventor: Kenneth L. Pottebaum, Yukon, Okla.

[73] Assignee: Magnetic Peripherals Inc., Minneapolis, Minn.

[21] Appl. No.: 773,280

[22] Filed: Sep. 6, 1985

[51] Int. Cl.⁴ .............................................. H05K 7/20
[52] U.S. Cl. ................................... 417/424; 361/384; 361/390; 416/187
[58] Field of Search .............................. 361/384, 390; 416/186 R, 181, 187; 417/424, 420

[56] References Cited

U.S. PATENT DOCUMENTS

| | | | |
|---|---|---|---|
| 2,918,017 | 12/1959 | Collins | 416/181 X |
| 4,304,532 | 12/1981 | McCoy | 417/420 |
| 4,513,351 | 4/1985 | Davis et al. | 361/384 |

Primary Examiner—Carlton R. Croyle
Assistant Examiner—Theodore Olds
Attorney, Agent, or Firm—J. A. Genovese; M. B. Atlass

[57] ABSTRACT

A fan is disclosed that contains cut-outs that reduce the noise levels. The fan is used to cool circuit boards.

6 Claims, 5 Drawing Figures

QUIET CENTRIFUGAL FAN

This invention relates to structures for reducing the noise produced by operation of centrifugal fans while at the same time retaining air flow capacity and more particularly to the use of such structures in computer disk drives.

BACKGROUND OF THE INVENTION

This invention provides for a centrifugal fan blade structure or assembly which is capable of producing efficient air flow during use with substantially less noise than is produced by prior centrifugal fans of similar configuration or size. The movement of air into and out of the housings of various units of equipment in use in the work place is done by means of various fans, for the most part. As more and more machines are moved into the work environment, the level of noise created by fans increases substantially. Nevertheless, machines that are used in the modern office, including computer disk drives must maintain adequate air flow for various purposes, in particular but not limited to maintenance of air pressure differentials and air flows. Accordingly, this invention provides a design structure to produce a quiet fan with adequate air flow.

The structural configuration of the preferred embodiment was developed to reduce the noise created by a prior open bladed configuration as is described in more detail below with reference to the preferred embodiment.

SUMMARY OF THE INVENTION

A centrifugal fan blade assembly such as the one described herein, is basically comprised of two parallely disposed flat plates or disks of similar diameter with blades that radiate from a circular cut-out hub area to the outer diameters of said plates and extend from one disk to the second disk in a direction normal to the plane of either disk. The blade assembly is usually contained in a housing. The cut-out center hub area of one or both of the plates is known as the inlet area of the centrifugal fan blade assembly, and the exhaust or outflow of the centrifugal fan blade assembly is an opening in the housing adjacent to the edges (external or distal circumferences) of the disks. This invention provides for shaped cut-outs in the disk which faces the inlet area. Cut-outs may be provided in the other disk if desired or if the surface of the other disk provides a second inlet area. It is contemplated that where no disk (that has a cut-out hub type inlet area) is used, the inlet area will include behind the blade cut-outs that can be better characterized as open areas behind blades, and the blades will have forward-reaching protrusions in the plane where the inlet side disk would otherwise be. Such a characterization is believed to be within the scope of the teachings of this invention, although the preferred embodiment teaches a paired, parallel flat disk configuration with paddle wheel-type blades extending between those disks since such air assembly fits easily into the configuration of the overall structure in which the preferred embodiment blade assembly operates.

Unequal spacing is provided between the blades to break up the frequency content of the noise produced by the blades.

In the preferred embodiment, the fan blades and one plate or disk are fixed to a rotor on (or beneath) a magnetic media disk drive storage unit. Air is pulled into the fan blades generally from areas around circuit boards and then pushed outwardly from the disk drive unit by the fan blades.

DETAILED DESCRIPTION OF PREFERRED EMBODIMENT

The preferred embodiment describes a fan structure specifically adapted for use in a magnetic disk media information storage unit. The particular structure described is drawn to dimensions which fit within a space already existing in such a unit. The preferred embodiment, therefore, should be understood as illustrative only and the claimed invention should not be limited to the description of the preferred embodiment.

Figure 1:
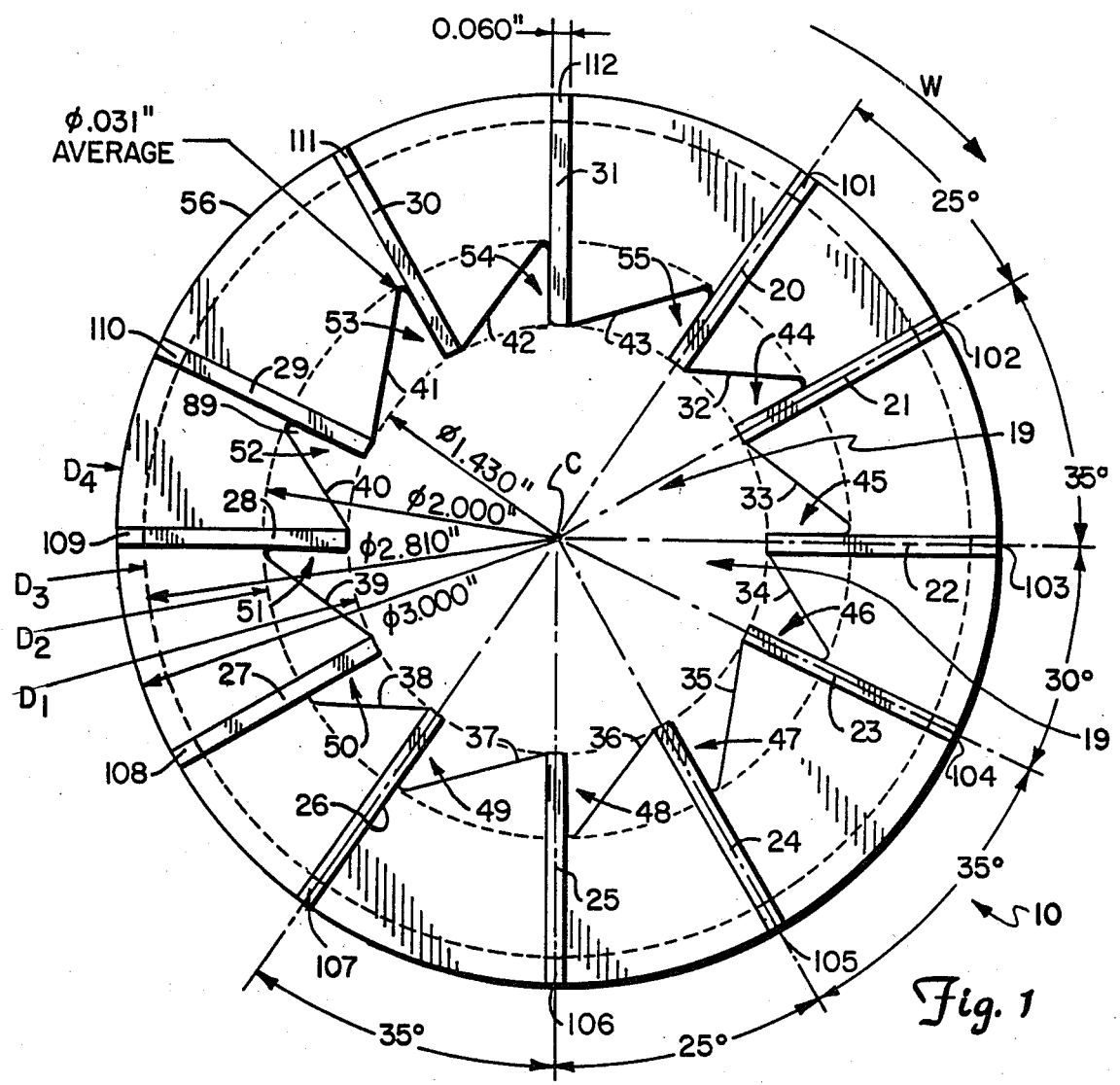
FIG. 1 shows the fan blade assembly with one disk or plate removed, viewed from the side of the removed disk.

Referring now to FIG. 1, the overall structure of the centrifugal fan blade and disk assembly (sans rotor 9) is a partial assembly referred to with the numeral 10 and is viewed from the side to which rotor 9 would be attached. (The centrifugal fan blade assembly is reference numeral 11 of FIG. 5.) The partial assembly 10 consists essentially of a flat disk 56 and fan blades 20-31. Fan blades 20-31 are oriented along radii extending from a line C, normal to the plane of disk 56, at the center of disk 56 (in this view being a point C). As is known in the art, the number and spacing of the blades may be varied and the blades themselves may be curved forwardly or backwardly. Such variants would be considered within the scope of this invention so long as the principles described herein are applied substantially as taught.

Although it is well known in the art, it is relevant to note that the spacing between one blade and the next, for example blade 20 to blade 21 and blade 21 to blade 22, varies. This structure of blades disposed at varying angular distances from one another, is well known to break up the frequency content of the noise generated by the rotating fan assembly. So long as the angles distribute the blade/disk weight evenly about the center of the assembly, no imbalance will result from such blade distribution.

Figure 2:
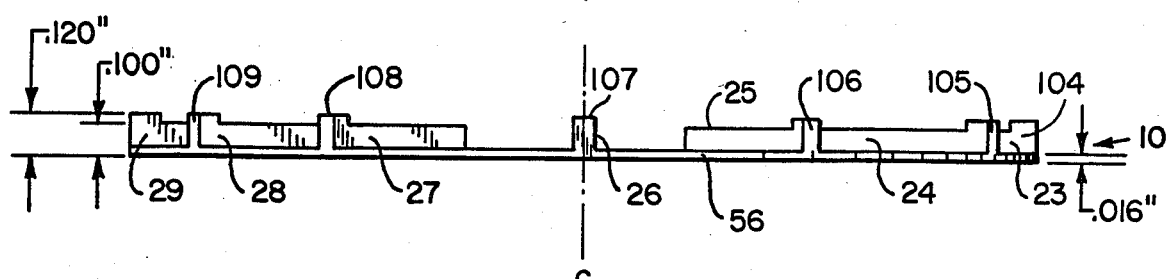
FIG. 2 is a side view of the same structure pictured in FIG. 1.

FIG. 2 shows a side view of fan blades 23 through 29 as they are firmly mounted on (or integrally formed with) disk 56. Because of the size limitations of the structure for which the blade assembly of the preferred embodiment was developed, the outer diameter of disk 56 is 3.000 inches and the height of the blades 20-31 is 0.100 inches through most of the body of the blade and 0.120 inches at the outer edge of the blade. The enhanced size of outer edges 101-112 (FIG. 1) permit easy mounting and centering of the blade and disk assembly 10 onto rotor 9. Any other suitable mounting or forming arrangement which would be apparent to one skilled in the art would be considered an equivalent structure such as, for example, forming the entire assembly 11 as an integral unit. (Rotor 9 (seen in FIG. 5) is the motor rotor used for turning media platters or disk(s) 90 in housing 7 by means of spindle 8.)

Figure 3:
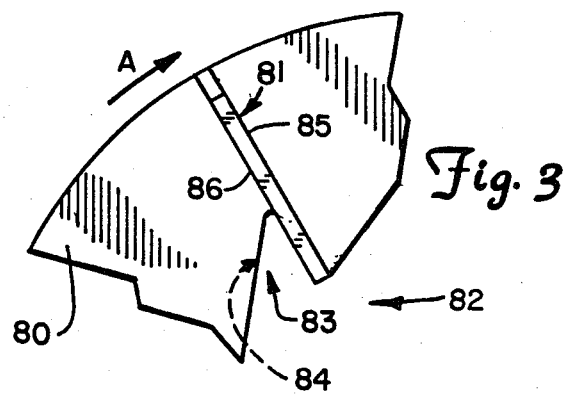
FIG. 3 is a cut away of a portion of one of the disks of the fan assembly with one fan blade shown thereon, for illustrating the principles of this invention.
Figure 4:
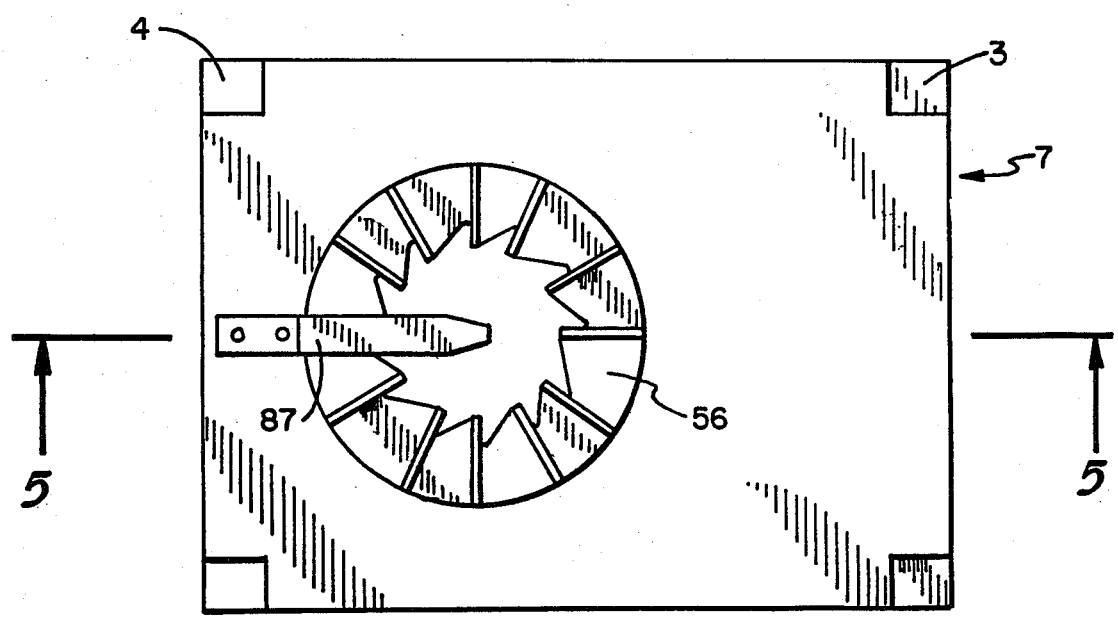
FIG. 4 is a top view of the preferred embodiment.

Referring back to FIG. 1, disk 56 is provided with what amounts to two (concentric and centrally disposed with respect to the external circumference D4) internal circumferences D1 and D2. In FIG. 1, the first internal circumference, D1 (the most centrally disposed) provides for the narrowest points of the inlet aperture 19 through disk 56. Circumference D2 (disposed distally from circumference D1) provides for the widest portion of the inlet aperture. If the blade assembly is turning in the direction given by arrow W, clockwise, then the air pressure caused by the rotation of the blades within the assembly 11 around a center point C will be greater on the leading edge of the blade then on the trailing edge. This can be easily seen with reference to FIG. 3 wherein the cut away portion of the disk 80 (shown) would be rotating in the direction indicated by arrow W. A blade 81 moving in the direction indicated by arrow W, would develop greater air pressure on the face or forward side 85 then on side 86 which is behind the blade 81. The generalized disk inlet aperture 82 is expanded by the cut-out 83 defined by line 84 as if cut from disk 80. Cut-out 83, therefore, would allow air (on the opposite side of disk 80 from blade 81) to enter at areas where the air pressure is lower (behind blade 81). It is believed that the extension of the disk (80, here) in front of the blade 81 does not allow air to flow back in the wrong direction (opposite to that of entry) through areas where air pressure is higher (i.e., in front of the blade 81). This special inlet geometry thus, apparently effectively increases the inlet size without reducing the effective blade size by allowing the blade to extend to the internal diameter D1 as illustrated in FIG. 1, while at the same time allowing for air to enter the fan from as wide an area as defined by circumference D2. Referring back to FIG. 1, it will be noted that one cut-out 44–55, is provided for each blade 21–20, clockwise, respectively. These cut-outs are defined on one side by lines 32–43, respectively, and at their distal end by circumference D2. For example, blade 110 has its cut-out 52 defined by line 40 extending from circumference D1 to point 89. The exact path of the line 40 and its similarly situated lines, in the preferred embodiment, extends straight from D1 at the internal edge of one blade to a point on D2 less than ⅛ inch from the trailing edge of the next forward blade, and from that point over in an arc or flat to that trailing edge. The side behind or trailing edge of each blade provides the forward edge of the cut-out, and the central area of the cut-out is open to a completely removed central portion of disk 56 defined at its distal perimeter by circumference D2. These cut-out areas and central circular cut-out defined by D2 form the inlet area 19. (For support of the assembly, some structure (not shown) may be attached to or formed integrally with disk 56 which may block portions of the inlet area to allow the attachment of a spindle or shaft (also not shown), upon which the assembly may rotate.)

It can be easily seen after this description of the cut-outs in the assembly, that a wider inlet space is provided at the area of lower pressure (behind the blade) and that this wider space tapers to a narrower space when it reaches an area in front of the blade. The exact geometry of the cut-out is not critical but it is important that whatever the geometry is, it provide for a wider inlet at the area of lower pressure and a narrower inlet at the face of the blade, an area of higher pressure. It will be seen from FIG. 1, that because of the irregular spacing of the blades 20–31, the slopes of lines 32–43 are drawn to match (or fit) this irregular pattern of spacing. The larger width portion of the cut-out may be terminated distally at some point further, distally, than circumference D2, so long as the structural integrity of the overall assembly 11 is not impaired. Likewise, the larger width portion may be terminated distally within circumference D2 within the teachings of this invention. The specific ratios of circumferences shown may be used to scale up or down the size of the fan within the preferred embodiment and the ratios themselves may be altered as well, so long as there is a larger opening on the low pressure side of the blade(s) as described above.

Figure 5:
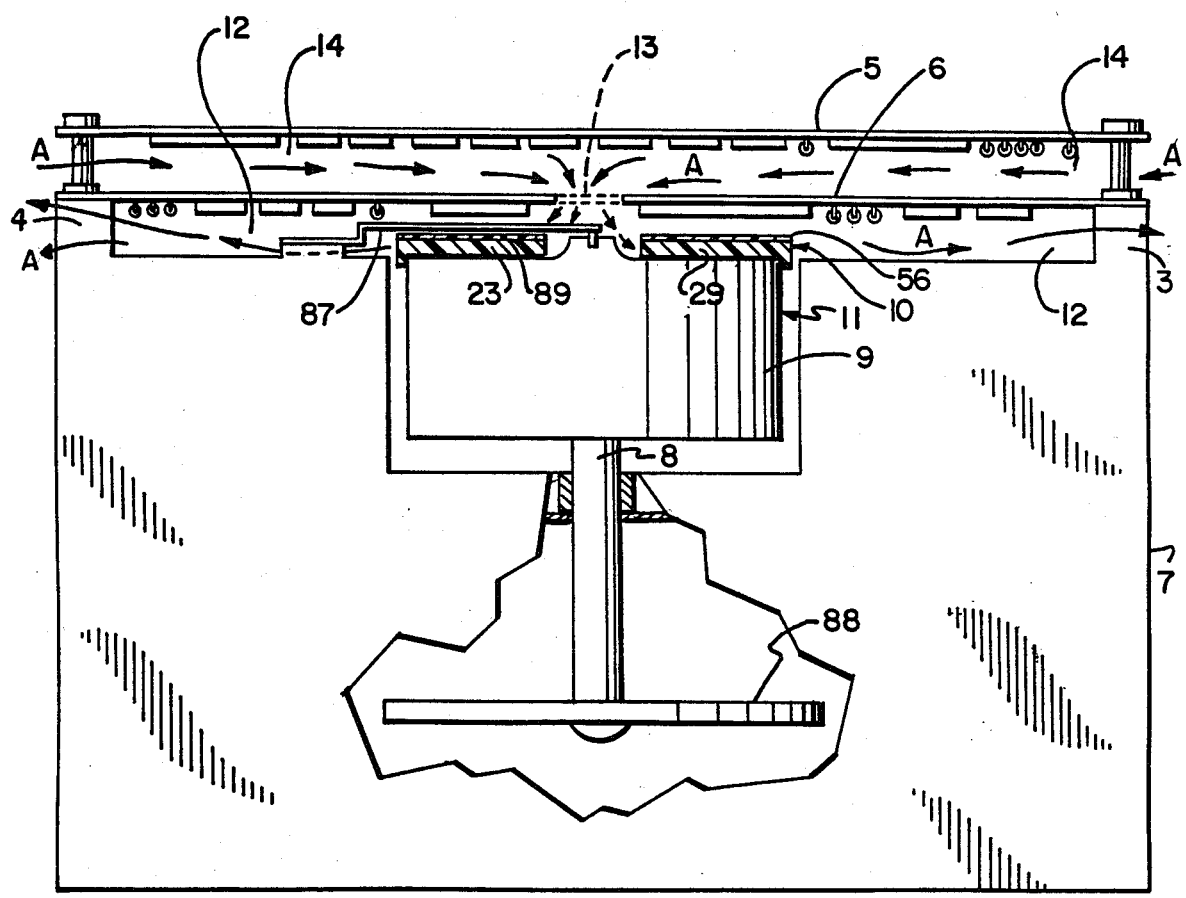
FIG. 5 is a view of the preferred embodiment taken at line 5—5 of FIG. 4.

Referring now to FIG. 5, the blade and disk assembly 10 is seen attached as it is in the preferred embodiment to a rotor 9 to form a fan blade and rotor assembly 11 with a media platter 88 connected thereto via spindle 8. (Rotor 9 is the motor rotor for rotating the platter 88.) In this side view, point 89, coincident with the circumference D2 of FIG. 2, is visible. Above disk 56 is seen conductive element 87, which is electrically connected to the center of the rotor 9 to prevent electrical build-up from occurring on the media 88 connected to spindle 8. Conductive element 87 is electrically connected to drive enclosure housing 7 by means of screws Z and R. In operation, air flow is indicated on FIG. 5 by arrows A. The primary air flow is directed through interstice 14 which is a space between circuit boards 5 and 6, and directed through aperture 13 in circuit board 6. Aperture 13 should be an appropriate diameter to ensure that the primary air flow proceeds in the direction just indicated, approximately one-half inch for the three-inch blade as employed by the preferred embodiment. Air is then directed outwardly by the blades 20 through 31 through interstice 12 to an area outside the drive enclosure housing 7. Clearance between circuit board 6 and conductive element 87 is approximately 0.055 inches in the preferred embodiment and interstice 14 gives a clearance of approximately 3/16 of an inch between the elements of circuit board 5 and the back of circuit board 6. These dimensions may, of course, be varied as is known in the art. In previous fan assemblies, blades were merely built onto the upper surface of rotor 9 with no covering such as disk 56 or of any configuration. Addition of disk 56 to quiet the blades decreases their effective width by the width of disk 56 (that is, otherwise the blades could extend to a width equal to the blade width shown plus the width of disk 56). Nevertheless, the design of this invention produces approximately 85 percent of the air flow which was produced by the former open bladed assembly at substantially reduced sound level. In both the prior design and this one the rotational speed is the same, approximately 3600 revolutions per minute. In the prior design, the fan blades were equally spaced, but 14 blades were required to deliver adequate air flow. This invention produces approximately 85 percent of the air flow of the fan or design with only 12 blades and eliminates a substantial portion of the fan noise.

What is claimed is:

1. A rotatable centrifugal fan blade assembly comprising:

first and second substantially parallely disposed circular disk members each having an outer circumference, wherein at least one of said disk members has a centrally disposed aperture, a multiplicity of blade members each disposed in a plane substantially normal to the planes of said disk members and extending there between, each such blade having face side and a trailing side during rotation of said assembly, and wherein at least one said first and second disk members has cut-outs removed therefrom and wherein each said cut-out is located between the locations of the connection between each of two of said blades with said at least one disk, and wherein said cut-out is defined by a larger area disposed toward the trailing side of one of said two blade members and by a smaller area disposed toward the face side of the other of said two blades and wherein said cut-out is continuous at its inside perimeter with said centrally disposed aperture.

2. An air flow circulation apparatus comprising:

a rotatable centrifugal fan blade assembly as set forth in claim 1 wherein only said first disk member has a centrally disposed aperture and wherein the second of said disk members comprises a rotor and wherein said circulation mechanism further comprises:

a spindle member turnable by said rotor by attachment thereto, which extends from said rotor in a direction opposite from said first disk member, with respect to said rotor (second disk member), a housing, into one side of which said spindle extends and which is provided with mounting means which protrude from that side of said housing into which said spindle extends, at least first and second circuit board members mounted on said mounting means of said housing, the first of which is mounted relatively near to said first disk member and is provided with an aperture so arranged and disposed to allow air flow to pass from the side opposite said first disk member to the side facing said disk member and wherein said second circuit board member is mounted in such a way that said first circuit board member aperture is covered by said second circuit board member but such that an interstice exists between said first and second circuit board members of sufficient size to permit air flow there between.

3. In a computer disk drive wherein information is stored on magnetic media, and an air flow apparatus as set forth in claim 2, wherein said apparatus further comprises: a magnetic media disk mounted on said spindle.

4. An air flow apparatus as set forth in claim 2 wherein said apparatus further comprises:

an electrically conductive element between said rotor and said housing extending from the center of said rotor to said housing.

5. An air flow apparatus as set forth in claim 3 wherein the rotor has a surface which is perpendicular to said spindle's long axis, wherein said surface has a centrally located substantially cone-shaped mass, the substantially flattened apex of which is directed into said centrally disposed aperture.

6. An air flow apparatus as set forth in claim 1 wherein the rotor has a surface which is perpendicular to said spindle's long axis, wherein said surface has a centrally located substantially cone-shaped mass, the substantially flattened apex of which is directed into said centrally disposed aperture.

* * * * *